(12) United States Patent
Xie et al.

(10) Patent No.: US 6,646,418 B1
(45) Date of Patent: Nov. 11, 2003

(54) METHOD AND APPARATUS FOR FUEL CELL PROTECTION

(75) Inventors: Chenggang Xie, Phoenix, AZ (US); Jerald A. Hallmark, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/202,594

(22) Filed: Jul. 24, 2002

(51) Int. Cl.$^7$ .............................................. H01M 10/46
(52) U.S. Cl. ....................................... 320/120; 320/121
(58) Field of Search ................................ 320/103, 116, 320/118, 119, 120, 121, 122, 161, 162, 163, 164

(56) References Cited

U.S. PATENT DOCUMENTS 4,931,947 A * 6/1990 Werth et al.
4,962,462 A * 10/1990 Fekete
5,170,124 A   12/1992 Blair et al.

FOREIGN PATENT DOCUMENTS

WO    WO 02/03086 A2    1/2002

* cited by examiner

Primary Examiner—Edward H. Tso
(74) Attorney, Agent, or Firm—Barbara R. Doutre; Douglas W. Gilmore

(57) ABSTRACT

A fuel cell system is protected by monitoring at least one fuel cell parameter, comparing the parameter to a preset level, and disconnecting or reconnecting a main load in response to the fuel cell parameter. For example, a fuel cell system (300) is provided with a protection circuit (304, 308) that prevents operation of the fuel cells in the negative dP/dI region. System (300) includes a stack of fuel cells (302) connected in series and coupled to a main load (310). A controller (304) provides a control signal (314) based on the individual fuel cell voltage levels falling above or below a preset level. Control signal (314) is used to control a load switch (308) coupled between the stack of fuel cells (302) and the main load (310). The load switch (308) disconnects the main load (310) in order to prevent operation of the fuel cell cells in the negative dP/dI region.

33 Claims, 7 Drawing Sheets

METHOD AND APPARATUS FOR FUEL CELL PROTECTION

FIELD OF THE INVENTION

This invention relates generally to fuel cells and more specifically to fuel cell protection means.

BACKGROUND OF THE INVENTION

Fuel cells provide clean, direct current (DC) electricity. Fuel cells convert reactants, namely fuel and oxidant (air or oxygen), to generate electric power and reaction products. A typical fuel cell power source is constructed from a stack of cells coupled in series as shown in FIG. 1. For a series electrical connection 100, the same amount of current is drawn from each cell 102. In practice, each cell 102 has slightly different performance characteristics.

Fuel cells exhibit a decreasing output voltage as the current output is increased. This curve is not linear and tends to drop off faster at higher currents. Consequently, as can be seen in FIG. 2, the power vs. current characteristic 200 generally has a peak 202 at mid-current levels and then rolls off. Below the "peak power" point 202, as more current is drawn, the power increases. Above the "peak power" point 202, as more current is drawn, the power decreases. The region in which the slope of power vs. current is negative is referred to as negative dP/dI region 204. Beyond point 202, if the system tries to draw more power from the fuel cell, it quickly goes to low power (low voltage) and typically the support circuitry shuts off and the whole system stops working. In some cases, one of the cells may fail to work properly because of a temporary problem within the cell, such as a blocked micro-channel caused by particles or carbon dioxide bubbles. Therefore, it is desirable to monitor the system operation and avoid this condition.

Prior art fuel cell systems have included systems that monitor and compare the fuel cell voltage to a reference fuel cell voltage (Vfc), activating an alarm when the Vfc is exceeded. However, this type of system only provides for monitoring and alarm activation. Other systems have utilized a high power resistor and thermistor in conjunction with monitoring a voltage, and still other systems have used optoisolators. Again, these systems focus on monitoring the cell voltage and lack any constructive means of circuit protection.

Accordingly, a need exists for a protection apparatus and technique to prevent any cells from operating in the negative dP/dI region.

BRIEF DESCRIPTION OF THE DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale.

DETAILED DESCRIPTION OF THE DRAWINGS

In the description to follow below, there is provided an apparatus and technique of fuel cell protection in which a stack of fuel cells (either series-connected, parallel-connected, or combination of both) having a load operatively coupled thereto is monitored for pre-set conditions such that the load can effectively be temporarily disconnected from the fuel cells thereby placing the stack in a protective mode. These pre-set conditions include monitoring a fuel cell parameter, such as voltage, current, or power and comparing the parameter to a preset level, and then disconnecting/reconnecting the load when the preset levels are met. The preferred set of conditions includes monitoring the slope of power (through the load) versus current (through the cell) for operation in the positive slope region. The strategies described below are applicable to hybrid systems, where the fuel cell is used as a (battery) charger and where the power can be temporarily interrupted without impacting the overall device performance.

Figure 3:
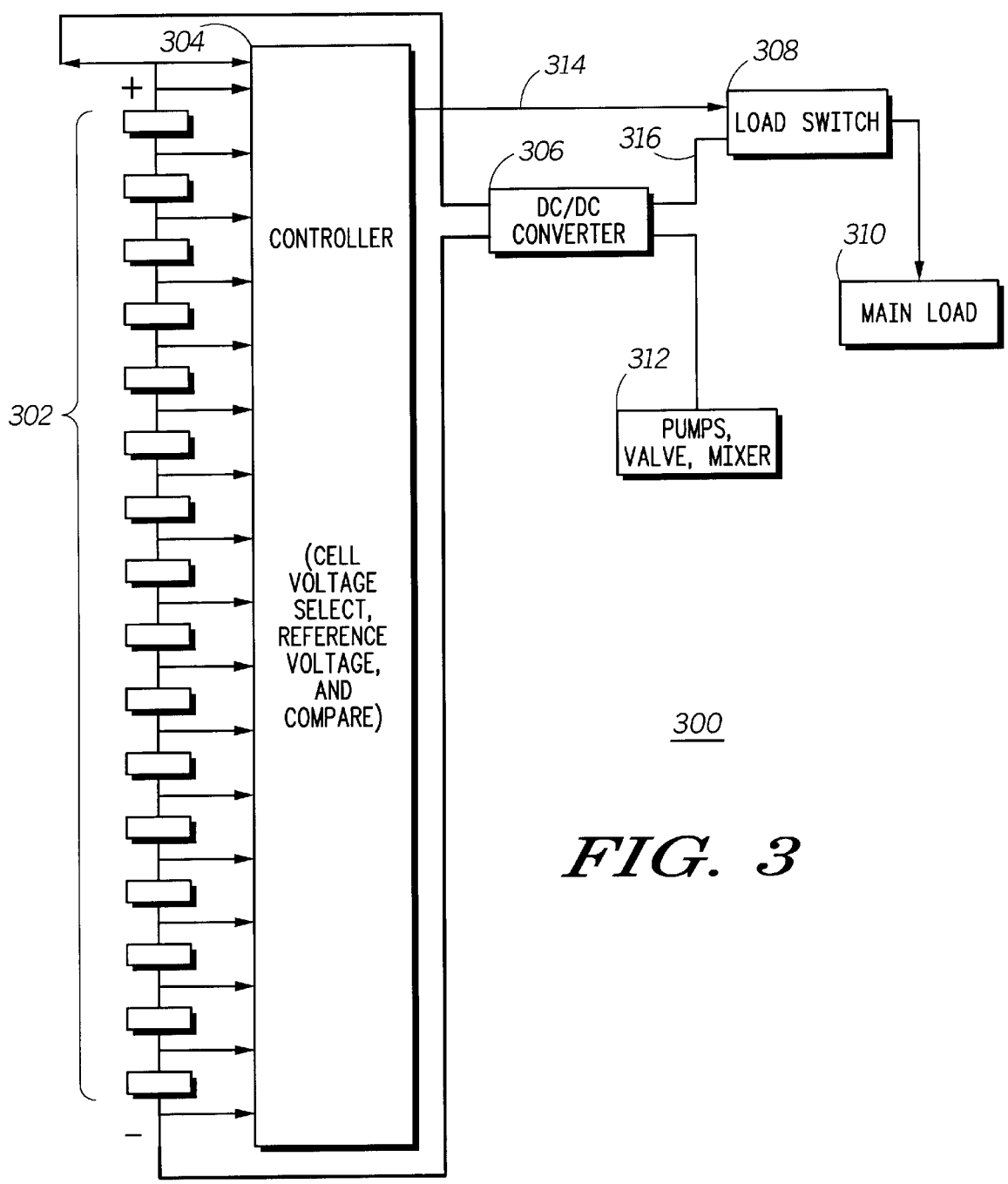
FIG. 3 is a block diagram of a fuel cell system including a protection circuit in accordance with a first embodiment of the invention.

Referring to FIG. 3, there is shown a block diagram of a fuel cell system 300 having a protection circuit in accordance with a first embodiment of the invention. System 300 includes a plurality of fuel cells 302 connected in series, a controller 304, a DC/DC converter 306, a load switch 308, a main load 310 and a secondary load 312. Each fuel cell, depending on load, typically generates a voltage of about 0.25 to about 0.7 volts. When connected in series, the stack output voltage is the sum of the voltages generated by the fuel cells. Depending upon the load, and assuming that all fuel cells are operating efficiently, the stack operates to about 11.2 volts for a stack of 16 cells. Higher voltages can be achieved by adding more fuel cells to the stack in series depending on the application.

The main load 310 generally represents a hybrid system, such as a battery, capacitor, or other energy storage device. The secondary load 312 operates as fuel cell support circuitry and includes such items as pumps, valves, mixer, fan, sensor and controlling electronics. The support system circuitry is well known in the art and for the sake of simplicity will not be described further.

For the embodiment of system 300, the load switch 308 is coupled between the plurality of fuel cells 302 and the main load 310. In accordance with the first embodiment, the load switch 308 operates by temporarily disconnecting the main load 310 from the system 300 when the voltage of any cell from the plurality of cells 302 falls below a preset level. Conversely, the load switch 308 reconnects the main load 310 when the cell voltage rises above the preset level.

Figure 1:
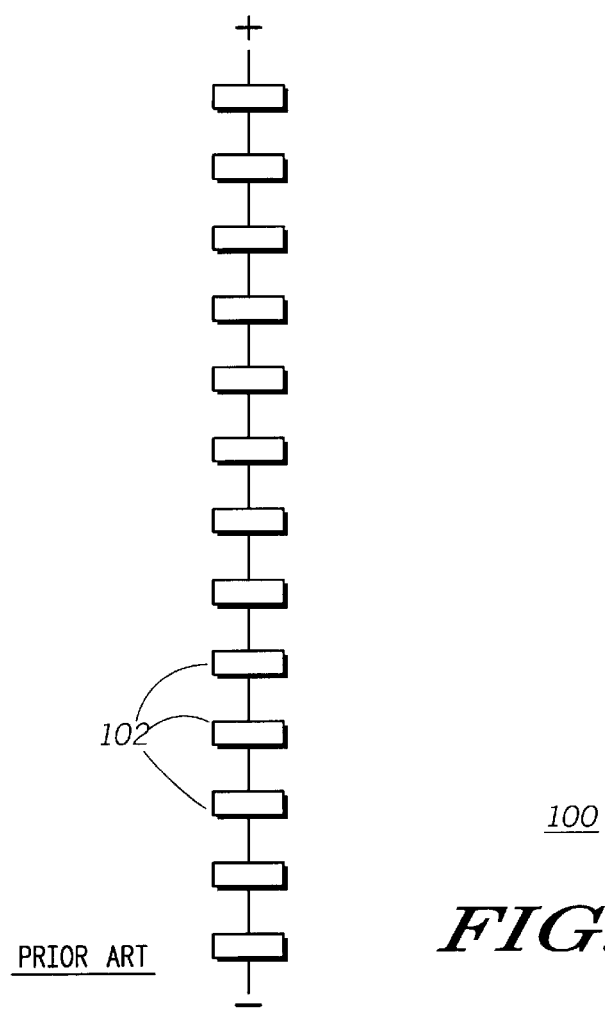
FIG. 1 is a block diagram representation of a typical stack of fuel cells coupled in series.
Figure 2:
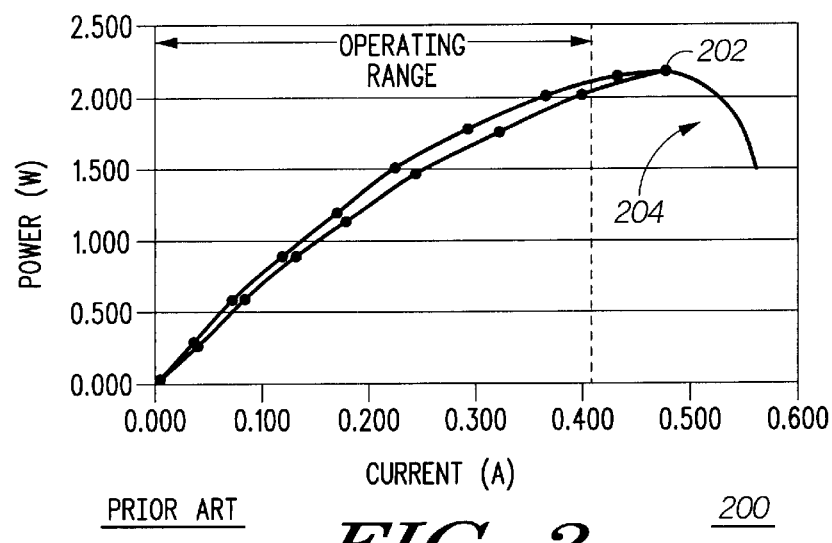
FIG. 2 is a graph of power versus current for a typical fuel cell operating under various load conditions.

The controller 304 can be any controller/microprocessor type device known in the art that provides individual cell voltage monitoring capability, a precision reference voltage, and comparator functionality. In accordance with the first embodiment, the controller provides a control signal 314 indicating that one or more individual cell voltages has reached a preset level. In some cases, to simplify the system, the sum of more than one cell voltage, instead of individual cell voltages, is monitored and compared to a preset level. The load switch 308 receives the control signal 314 as well as a converted output voltage 316 generated by the DC/DC converter 306. The load switch 308 is responsive to the control signal 314 for switching in and out the main load 310. The load switch 308, coupled between the plurality of fuel cells 302 and the main load 310, disconnects the main load from the fuel cell system 300 in response to the control signal 314 to prevent operation of the fuel cell system in the negative dP/dI region as previously described in FIG. 2. A timing circuit can be added, if desired, to control switching in and out the main load 310 or sourcing power on or off to the load. To give more time for the system to recover, it may also be desirable to provide a short recovery time period after the cell voltage rises above the preset level.

Figure 4:
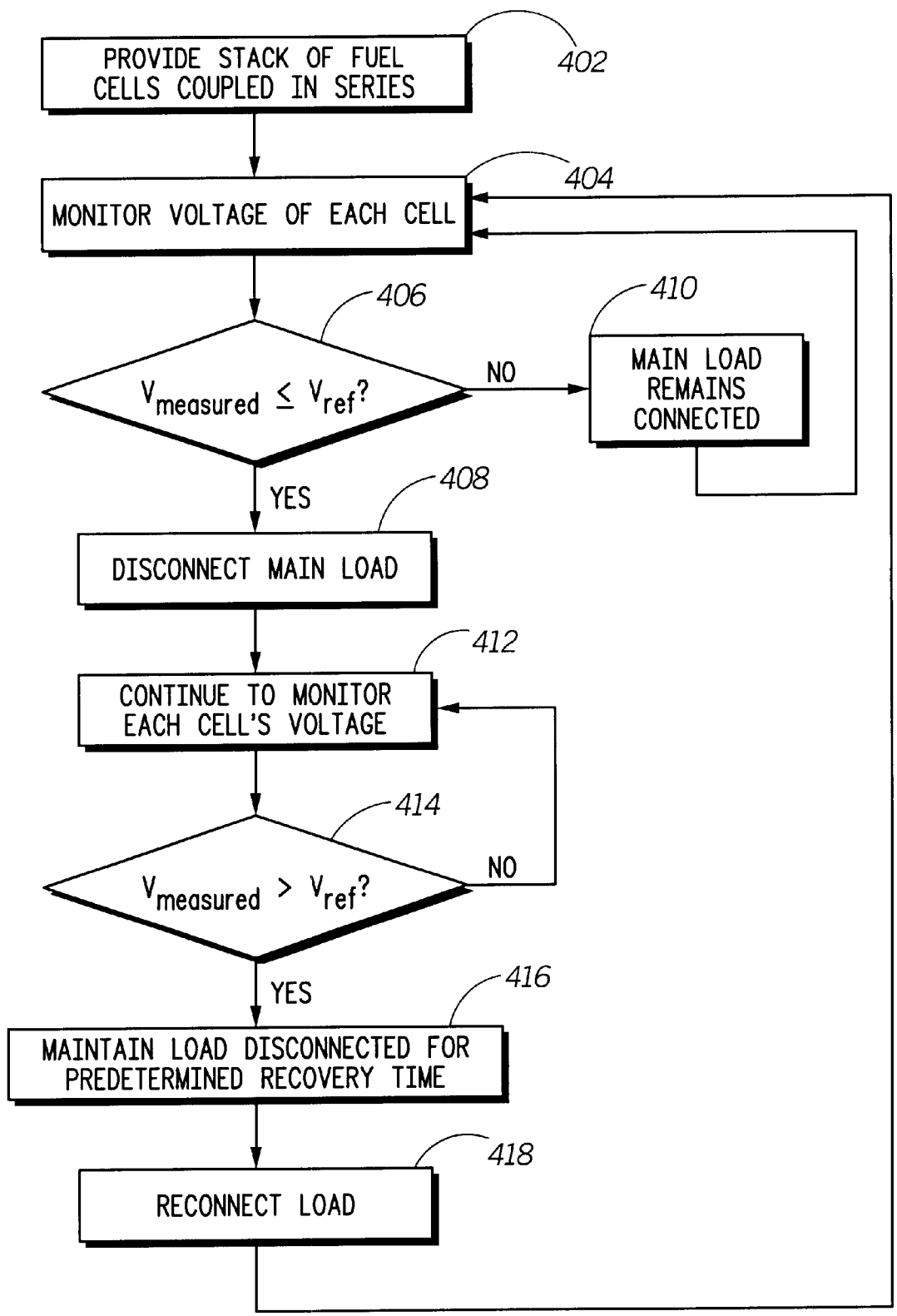
FIG. 4 is a flow chart illustrating a method for protecting a fuel cell system in accordance with the first embodiment of FIG. 3.

Referring now to FIG. 4, there is shown a flow chart illustrating a method 400 for protecting fuel cells from entering the negative dP/dI region in accordance with the first embodiment of FIG. 3. Method 400 begins by providing a stack of fuel cells coupled in series and coupled to a load (step 402). Next, by monitoring the voltage of each cell (step 404), comparing each voltage to a preset reference voltage (Vref) (step 406) and disconnecting the load (step 408) in response to the voltage falling below (or equal to) the preset level, the system thereby enters a protective mode. Conversely, the load remains connected at step 410 in response to the voltage being above the preset level.

By disconnecting the main load, the fuel cell system is prevented from entering the negative dP/dI region. Method 400 further includes the steps of continuing to monitor (step 412) each cell voltage, as the cells are still coupled to the secondary load, and compare the cell voltages to the preset level (step 414) until each cell voltage returns above the preset reference level (step 414). If desired the switch can remain off to allow for additional recovery time (step 416) before reconnecting the main load (step 418).

As mentioned previously, the sum of more than one cell voltage, instead of individual cell voltages, can be monitored and compared to a reference voltage. As for the method 400 described above, step 404 can be replaced with the step of monitoring the voltage of the stack of cells (or a group of cells within the stack). Step 412 can be replaced with continuing to monitor and compare the stack voltage (or group of cells within the stack) until the voltage returns above the preset reference level.

Another alternative method for protecting fuel cells provides for tracking the power through the load versus the voltage of the stack and determining the slope. This method 500 is depicted by the flow chart of FIG. 5. Method 500 begins with the step of providing a stack of fuel cells connected in series and coupled to a load (step 502), followed by the steps of monitoring the voltage of the stack (step 504) and tracking power drawn by the load (step 506), by measuring total cell current and total cell voltage and taking the product. Next, the step of determining a slope of the power through the load versus voltage (step 508) occurs. The system enters a protection mode by switching the main load off (step 512) in response to the slope being zero or positive (step 510). Conversely, the load remains connected (step 514) in response to the slope being negative. Upon entering the protection mode, the slope continues to be monitored (step 516), based on the stack being connected to the secondary load. The main load is reconnected when the slope reaches an appropriate level (step 518).

Another alternative method for protecting-fuel cells provides for tracking the power through the load versus the current of the stack and determining the slope. This method 600 is depicted by the flow chart of FIG. 6. Method 600 begins with the step of providing a stack of fuel cells connected in series and coupled to a load (step 602), followed by the steps of monitoring the current of the stack (step 604) and tracking power drawn by the load (step 606), a product of cell current and cell voltage. Next, the step of determining a slope of the power through the load versus current (step 608) occurs. The system enters a protection mode by switching the main load off (step 612) in response to the slope being zero or negative (step 610). Conversely, the load remains connected (step 614) in response to the slope being positive. The slope continues to be monitored (step 616) based on the stack being coupled to the secondary load. The main load is reconnected when the slope becomes positive (step 618).

Figure 7:
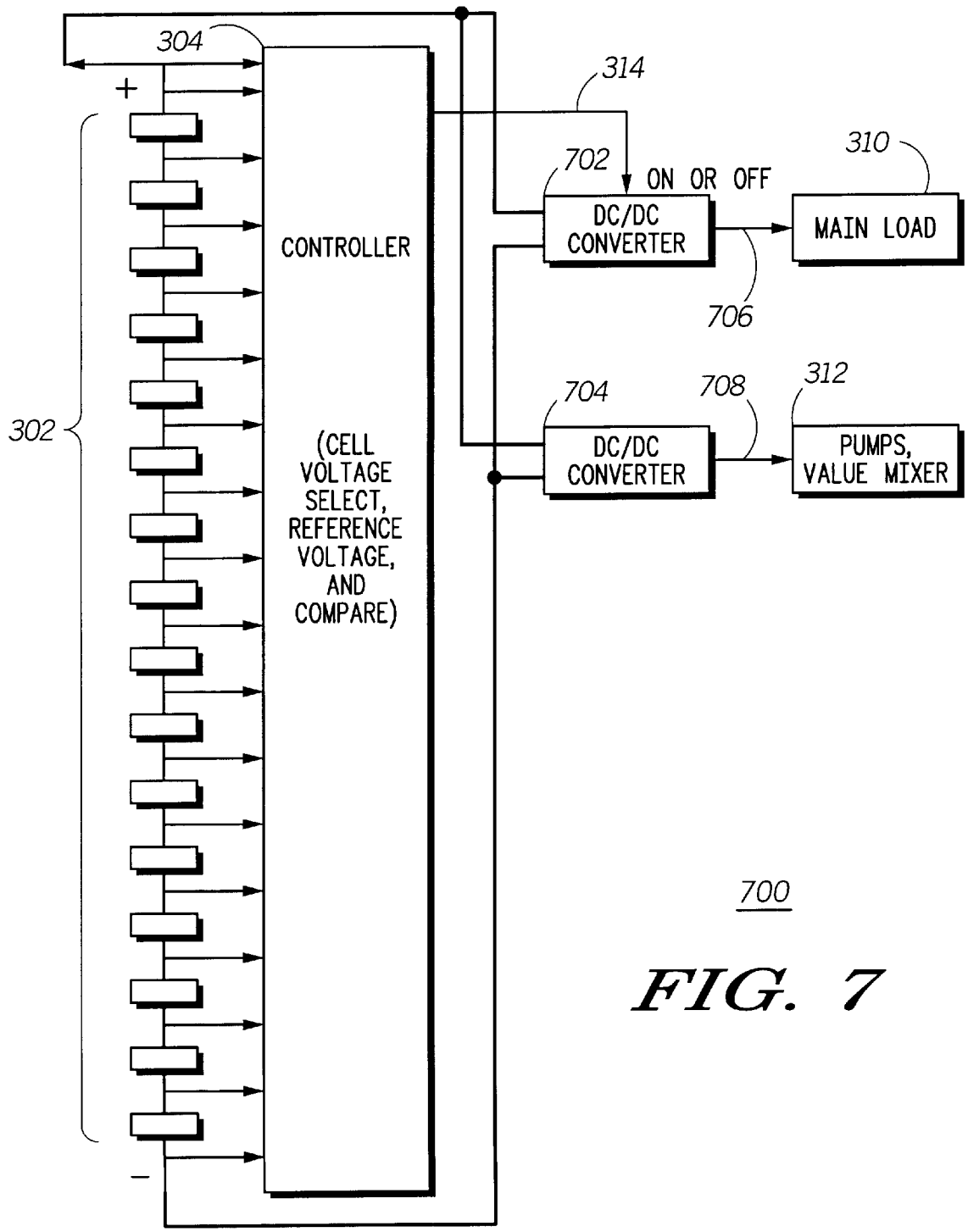
FIG. 7 is a block diagram of a fuel cell system including a protection circuit in accordance with another alternative embodiment of the invention.

Another fuel cell protection circuit in accordance with another alternative embodiment of the invention is shown in FIG. 7. Fuel cell system 700 includes fuel cells 302, controller 304 with control signal 314, main load 310, and fuel cell support circuitry 312 as previously described with reference to FIG. 3. Fuel cell system 700 further includes first and second DC/DC converters 702, 704. The first DC/DC converter 702 is powered by the fuel cells 302. In accordance with this alternative embodiment, the DC/DC converter 702 is turned on or off based on control signal 314. When the DC/DC converter 702 is turned on by control signal 314, a converted voltage output 706 powers the main load 310. When the DC/DC converter 702 is turned off by control signal 314, the main load 310 is effectively disconnected. The second DC/DC converter 704 is likewise powered by the fuel cells 302 and produces a converted output voltage 708 for powering the fuel cell support circuitry 312 (typically at much lower power). The alternative embodiment shown in FIG. 7 negates the use of the load switch described in FIG. 3, but utilizes a second DC/DC converter 702. Like the fuel cell system 300 of FIG. 3, the controller 304 monitors each cell voltage, compares each cell voltage to the reference voltage, and generates the control signal 314 for switching in and out the main load 310 by turning off or on the DC/DC converter 702.

Figure 5:
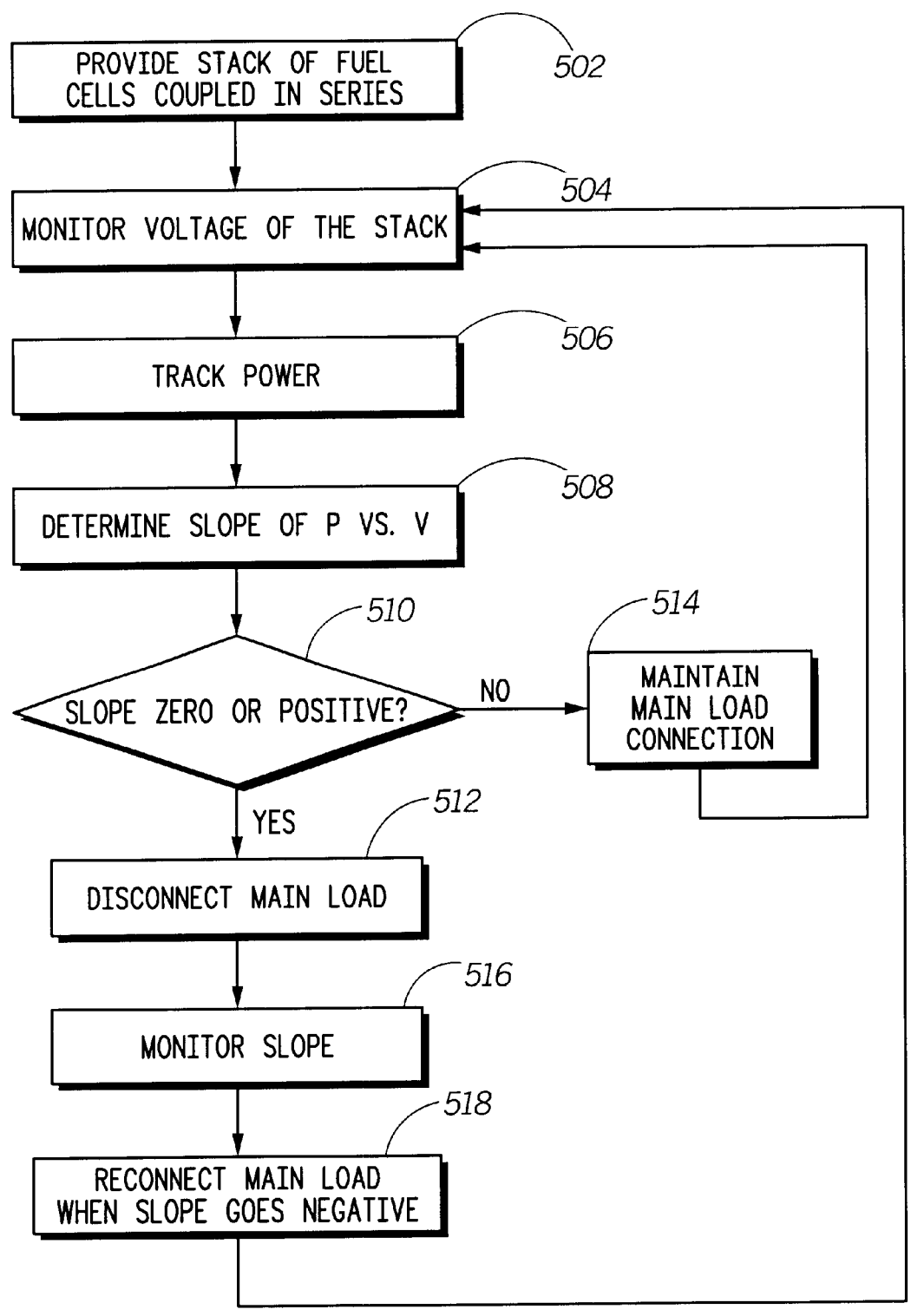
FIG. 5 is a flow chart illustrating a method for protecting a fuel cell system in accordance with an alternative embodiment of the invention.
Figure 6:
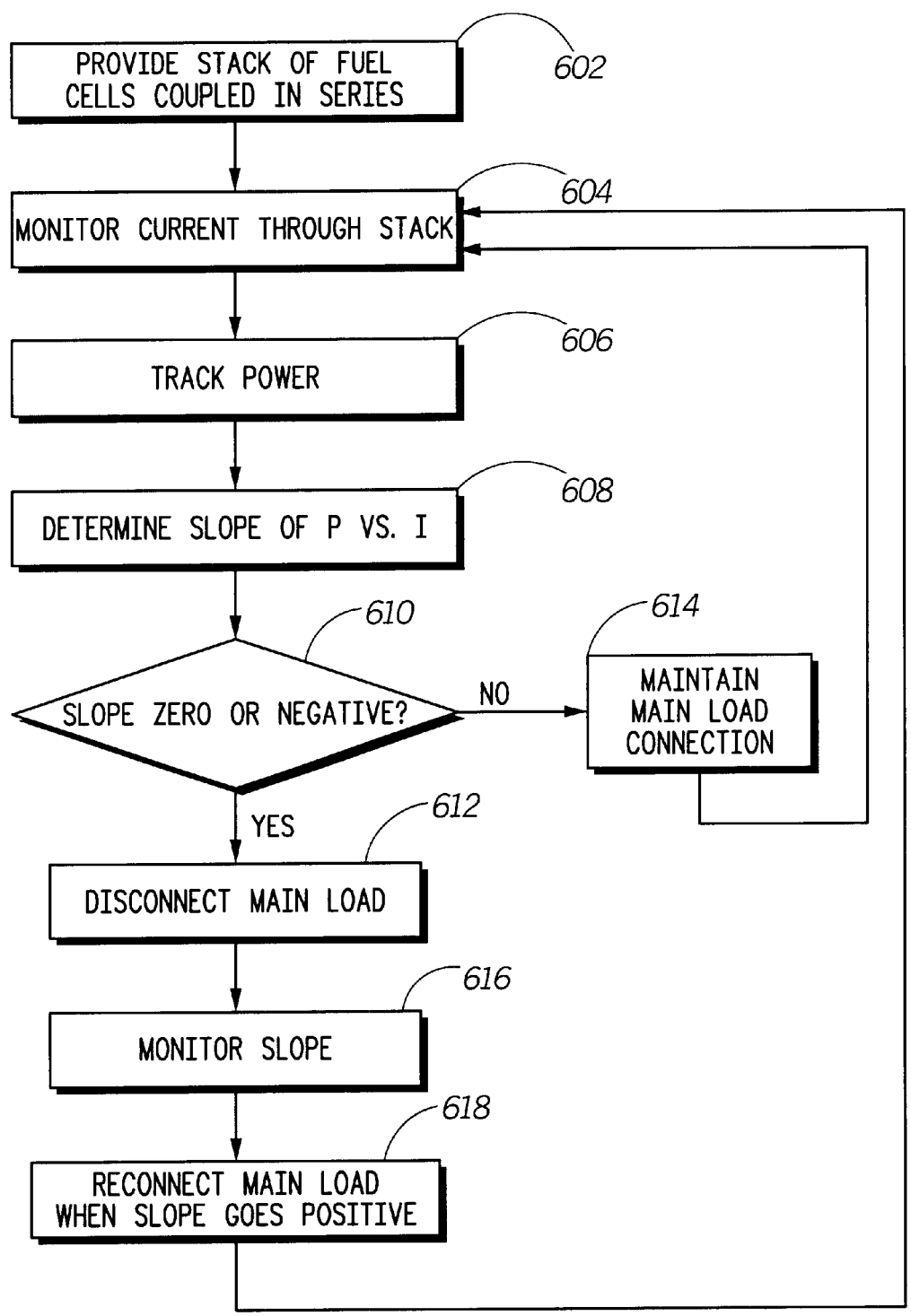
FIG. 6 is a flow chart illustrating a method for protecting a fuel cell system in accordance with another alternative embodiment of the invention.

The technique for protecting fuel cells from entering the negative dP/dl region described in FIGS. 4, 5, and 6 applies equally well to the embodiment of FIG. 7. Using the method of FIG. 4 as an example, the stack of fuel cells is coupled in series and coupled to a main load (step 402). By monitoring the voltage of each cell (step 404), comparing each voltage to a preset reference voltage (Vref) (step 406) and disconnecting the main load (step 408) in response to the voltage falling below (or equal to) the preset level, the system enters a protective mode. Conversely, the load connection is maintained (at step 410) if the voltage is above the preset level. In the alternative embodiment of FIG. 7, the main load 310 is effectively disconnected by turning off the DC/DC converter 702 with control signal 314.

By disconnecting the main load 310, the fuel cell system 700 is thereby prevented from entering the negative dP/dI region. As previously described in reference to FIG. 4, the steps of continuing to monitor (step 412) and compare the cell voltages to a preset level (step 414) are performed until each cell voltage returns above the preset reference level and the load is reconnected (step 418). If desired, the DC/DC converter 702 can remain turned off via control signal 314 to allow for additional recovery time (step 416) before reconnecting the main load (step 418). A timing circuit, preferably included as part of the controller, can control the recovery time in either system 300 or 700. Although described in terms of the method of FIG. 4, the alternative methods of FIGS. 5 and 6 are also applicable to system 700.

Figure 8:
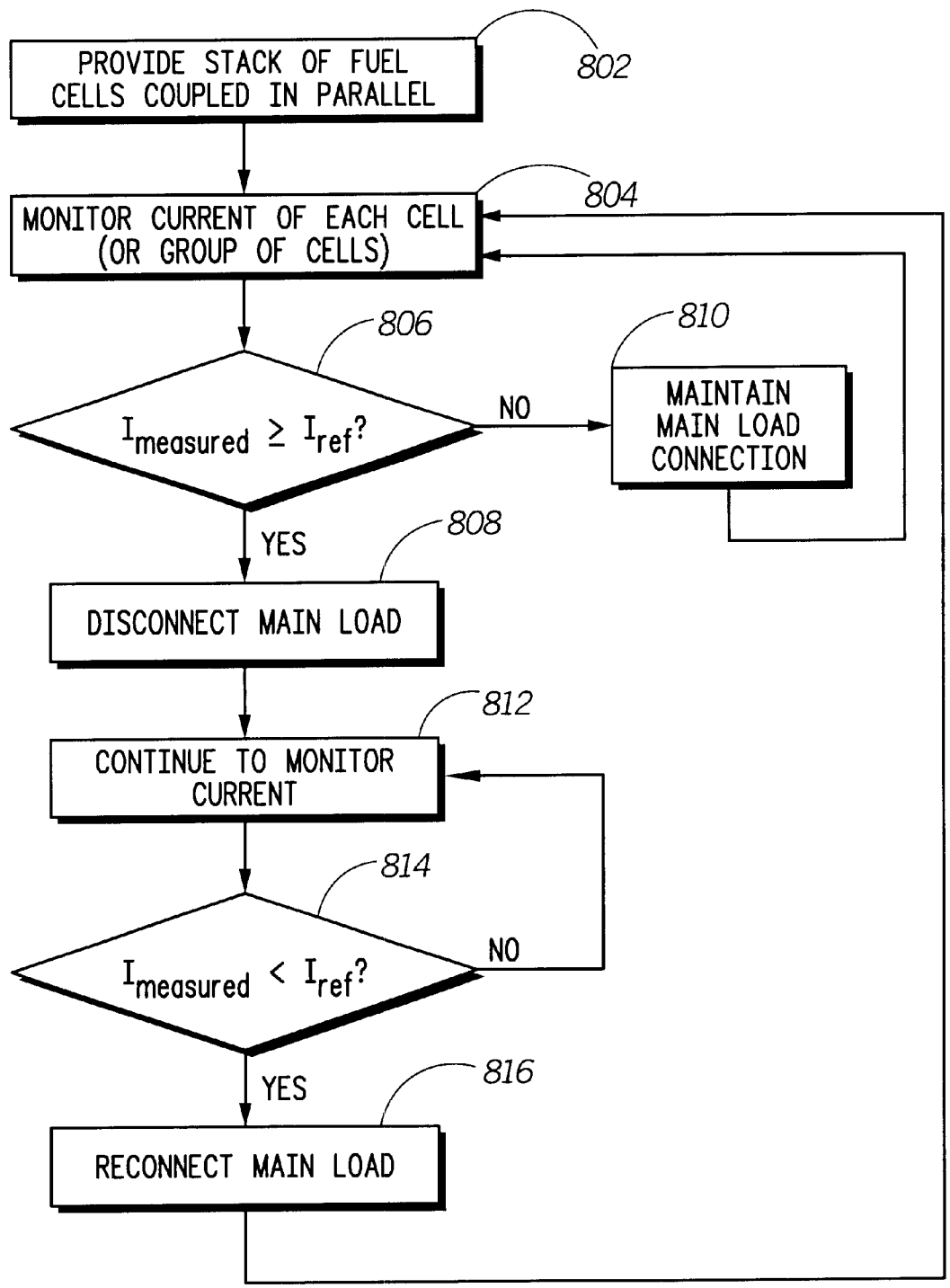
FIG. 8 is a flow chart illustrating a method for protecting a fuel cell system in accordance with another embodiment of the invention in which the cells are parallel-coupled.

While described in terms of series-connected fuel cells the fuel cell protection means of the present invention can be extended to fuel cells coupled in parallel as well. The apparatus embodiments of systems 300 and 700 previously described can thus be powered by parallel-coupled fuel cells. For fuel cell systems in which the cells are coupled in parallel, current can be monitored instead of voltage. Thus, the steps can be summarized in FIG. 8, as providing a stack of fuel cells coupled in parallel and coupled to a load (step 802), monitoring a current of each fuel cell (or group of fuel cells)(step 804),comparing each monitored current to a preset level (step 806), switching the load off (step 808) in response to the current rising above(or equal to) the preset level and maintaining the load on (step 810) in response to the current falling below the preset level. Once the load is switched off (step 808), the current continues to be monitored (step 812) and compared to a preset reference (step 814). The load is reconnected (step 816) when the current goes below the preset level. Additional recovery time can be added before reconnecting the main load if desired.

The steps taken for parallel cells can also encompass tracking the power of the stack and determining the slope of the power versus current. Again, if the slope is zero or negative (negative dP/dI region) then the load is disconnected temporarily. The main load gets reconnected when the slope goes positive.

Accordingly, there has been provided a fuel cell system having a protection circuit and technique to prevent operation of the system in the negative dP/dl region. By monitoring a fuel cell parameter, comparing the fuel cell parameter to a preset condition, and disconnecting and reconnecting the main load depending on the fuel cell parameter in relation to the preset condition, an effective fuel cell protection means has been provided. The fuel cell protection means of the present invention is particularly beneficial to hybrid, microfuel cell systems.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential features or elements of any or all the claims. As used herein, the terms "comprises,""comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

We claim:

1. A fuel cell system, comprising:
   a plurality of fuel cells connected in series;
   a voltage monitor for monitoring an individual voltage of each cell;
   a precision voltage reference to which each individual cell voltage is compared to a preset level;
   a load operatively coupled to the plurality of fuel cells; and
   a load switch coupled between the plurality of fuel cells and the load, the load switch disconnecting the load from the system when the voltage of any cell falls below the preset level and for reconnecting the load when the cell voltage rises above the preset level.

2. The fuel cell system of claim 1, wherein the load switch is kept off for a predetermined recovery time after the cell voltage rises above the preset level.

3. The fuel cell system of claim 1, further including a timing circuit to control the load switch.

4. The fuel cell system of claim 1, wherein the fuel cell system is used as a charger for a battery.

5. A method of protecting a fuel cell system, comprising:
   providing a stack of fuel cells connected in series and coupled to a load;
   monitoring a voltage of each fuel cell;
   comparing each monitored voltage to a preset level;
   switching the load off in response to the voltage falling below the preset level; and
   switching the load on in response to the voltage rising above the preset level.

6. The method of claim 5, wherein switching the load off further includes maintaining the load switched off for a predetermined amount of time after the voltage rises above the preset level.

7. A fuel cell system, comprising:
   a stack of fuel cells connected in series;
   a controller coupled to the stack, the controller providing individual cell voltage monitoring capability, a reference voltage, and comparator functionality to generate a control signal indicating that one or more individual cell voltages has fallen above or below a preset level;
   a DC/DC converter for sourcing power from the stack and providing a converted output voltage;
   a load switch for receiving the control signal and the converted output voltage; and
   a main load coupled to the load switch, the load switch responsive to the control signal for switching in and out the main load.

8. The fuel cell system of claim 7, further comprising a secondary load providing fuel cell support circuitry coupled to the DC/DC converter.

9. A fuel cell system, comprising:
   a plurality of fuel cells connected in series and coupled to a load;
   a controller for determining individual fuel cell voltage level and providing a control signal based on the individual fuel cell voltage levels, the control signal indicating whether fuel cell operation is in or out of negative dP/dI region; and
   a load switch coupled between the plurality of fuel cells and the main load, the load switch disconnecting the load from the fuel cells in response to the control signal to prevent operation of the fuel cell system in the negative dP/dI region.

10. A fuel cell system, including:
    a stack of fuel cells coupled in series;
    a controller coupled to the stack;
    a load operatively coupled to the fuel cells; and
    the controller monitoring each fuel cell voltage, comparing each fuel cell voltage to a reference voltage, and generating a control signal for disconnecting and reconnecting the main load.

11. The fuel cell system of claim 10, further comprising a first DC/DC converter powered by the stack of fuel cells and turned on or off by the control signal, the DC/DC converter for powering the main load when turned on by the control signal.

12. The fuel cell system of claim 11, further comprising:
a second DC/DC converter powered by the stack of fuel cells;
a second load comprising fuel cell support circuitry coupled to the fuel cells; and
wherein the second DC/DC converter generates a converted voltage output for powering the fuel cell support circuitry.

13. The fuel cell system of claim 10, further comprising:
a DC/DC converter powered by the stack of fuel cells and generating a converted output voltage; and
a load switch for receiving the control signal from the controller and for receiving the converted output voltage from the DC/DC converter, the load switch for connecting and disconnecting the main load to the converted output voltage in response to the control signal.

14. A method of protecting a fuel cell system, comprising:
providing a stack of fuel cells connected in series and coupled to a load;
monitoring the voltage of more than one cell within the stack;
comparing the monitored voltage to a preset level;
switching the load off in response to the voltage falling below the preset level; and
switching the load on in response to the voltage rising above the preset level.

15. The method of claim 14, wherein the step of monitoring the voltage of more than one cell comprises monitoring the voltage of the stack.

16. The method of claim 14, wherein the step of monitoring the voltage of more than one cell comprises monitoring the voltage of a group of cells within the stack.

17. A method of protecting a fuel cell system, comprising:
providing a stack of fuel cells connected in series and coupled to a load;
monitoring the voltage of the stack;
tracking power drawn by the load;
determining slope of the power versus voltage;
switching the load off if the slope is zero or positive; and
switching the load on in response to the slope being negative.

18. The method of claim 17, wherein the step of tracking power comprises measuring total cell current and total cell voltage and calculating the product as the power.

19. A method of protecting a fuel cell system, comprising:
providing a stack of fuel cells connected in series and coupled to a load;
monitoring the current of the stack;
tracking power drawn by the load;
determining a slope of the power versus current;
switching the load off, in response to the slope being zero or negative; and
switching the load on, in response to the slope being positive.

20. The method of claim 19, wherein the step of tracking the power comprises measuring total cell current and total cell voltage and calculating the product as the power.

21. A method of protecting a fuel cell system, comprising:
providing a stack of fuel cells coupled in parallel and coupled to a load;
monitoring a current of each fuel cell;
comparing each monitored current to a preset level;
switching the load off in response to the current rising above the preset level; and
switching the load on in response to the current falling below the preset level.

22. The method of claim 21, wherein switching the load off further includes maintaining the load switched off for a predetermined amount of time after the current falls below the preset level.

23. A fuel cell system, including:
a stack of fuel cells;
a controller coupled to the stack;
a load operatively coupled to the fuel cells; and
the controller monitoring a fuel cell parameter, comparing the fuel cell parameter to a preset level, and generating a control signal for disconnecting and reconnecting the load depending on the fuel cell parameter.

24. A method of protecting a fuel cell system, comprising:
providing a stack of fuel cells with a load operatively coupled thereto;
monitoring at least one parameter of one or more of the fuel cells;
comparing the parameter to a preset parameter level; and
disconnecting or reconnecting the load in response to the fuel cell parameter.

25. The method of claim 24, wherein the stack of fuel cells are coupled in parallel and the at least one parameter is current.

26. The method of claim 24, wherein the stack of fuel cells are coupled in series and the at least one parameter is voltage.

27. The method of claim 24, wherein the stack of fuel cells is coupled in series and the at least one parameter is current through the stack.

28. The method of claim 24, wherein the step of monitoring at least one parameter comprises monitoring current and voltage and the stack of fuel cells are coupled with a combination of series and parallel coupling.

29. A method of protecting a fuel cell system, comprising:
providing a stack of fuel cells operatively coupled to a load;
monitoring a parameter of the stack;
tracking power drawn by the load;
determining slope of the power versus parameter;
switching the load off on or off in response to the slope having a predetermined characteristic.

30. The method of claim 29, wherein the parameter is voltage and the load is switched off if the slope is zero or positive.

31. The method of claim 29, wherein the parameter is current and the load is switched off if the slope is zero or negative.

32. The method of claim 30, wherein the stack of fuel cells comprises a plurality of fuel cells coupled in series.

33. The method of claim 31, wherein the stack of fuel cells comprises a plurality of fuel cells coupled in parallel.

* * * * *